United States Patent
Ho et al.

(10) Patent No.: US 6,332,251 B1
(45) Date of Patent: Dec. 25, 2001

(54) RETAINING DEVICE FOR A HEAT SINK

(75) Inventors: Chih-Lung Ho, Tu-Cheng; Frank Shyu, Lu-Chou, both of (TW)

(73) Assignee: Adda Corp., Ping Tung (TW)

( * ) Notice: Subject to any disclaimer, the term of this patent is extended or adjusted under 35 U.S.C. 154(b) by 0 days.

(21) Appl. No.: 09/535,060

(22) Filed: Mar. 23, 2000

(51) Int. Cl.⁷ .................................................. H05K 7/20
(52) U.S. Cl. .............................. 24/459; 24/458; 165/80.3
(58) Field of Search .......................... 24/459, 458, 292; 301/704, 709; 165/80.3; 174/16.3; 439/331

(56) References Cited

U.S. PATENT DOCUMENTS

| | | | |
|---|---|---|---|
| 4,504,105 | * 3/1985 | Barkus et al. | 439/331 |
| 5,448,449 | * 9/1995 | Bright et al. | 361/704 |
| 5,495,392 | * 2/1996 | Shen | 165/80.3 X |
| 6,061,239 | * 5/2000 | Blomquist | 24/458 X |
| 6,181,559 | * 1/2001 | Seo | 24/458 X |

* cited by examiner

Primary Examiner—Robert J. Sandy
(74) Attorney, Agent, or Firm—David A. Belasco; Beehler & Pavitt

(57) ABSTRACT

A retaining device has a retaining belt and a handle pivotally connected with the retaining belt and having an arcuate portion and a flat portion. When the handle pivots relative to the retaining belt and when the arcuate portion engages the heat sink, the engagement between the heat sink and the socket will be enhanced. When the flat portion engages the heat sink, the engagement between the heat sink and the socket will be loosened.

6 Claims, 8 Drawing Sheets

RETAINING DEVICE FOR A HEAT SINK

BACKGROUND OF THE INVENTION

1. Field of the Invention

The present invention relates to a retaining device, and more particularly to a retaining device for a heat sink. The retaining device has a pair of retainers that are able to securely attach the heat sink to a socket for mounting a central processing unit (CPU) and a handle pivotally connected with the retainers. The handle has an arcuate portion and a flat portion, such that when the handle pivots, the engagement between the arcuate portion or the flat portion and an abutting latch block of the heat sink will loosen or secure the engagement between the heat sink and the CPU socket.

2. Description of Related Art

The purpose of a retaining device for a CPU heat sink is to securely attach the heat sink to a CPU socket, such that the fins of the heat sink dissipate the heat generated by the working CPU. Normally, a conventional retaining system shown in FIG. 8 has a socket (50) for receiving a CPU (60) thereon, which comprises a pair of latch blocks (55), a heat sink (70), a substantially U-shaped retaining belt (80), and a fan (75). A latch block (55) is formed on opposite sides of the socket (50). The heat sink (70) is detachably mounted on top of the socket (50) and has multiple rows of fins (71) extending out therefrom and a slot (72) defined between two adjacent rows of fins (71). The substantially U-shaped retaining belt (80) is received in the slot (72) and has a clamp (85) formed on a distal end and a through hole (86) defined in the clamp (85) to correspond to the latch blocks (55) of the socket (50). The fan (75) is securely mounted on top of the heat sink (70) to blow the heat away from the fins (71).

When the conventional retaining system is assembled, the heat sink (70) is placed on the socket (50) and then the retaining belt (80) seated in the slot (72) secures the heat sink (70) to the socket (50) by receiving the latch blocks (55) in the corresponding through holes (86). Then the fan (75) is attached to the heat sink (70) with screws. Because the retaining belt (80) is made of resilient material, when the latch blocks (55) are inserted into the corresponding through hole (86) of the retaining belt (80), the engagement between the heat sink (70) and the socket (50) is secured. However, such an engagement between the heat sink (70) and the socket (50) by means of the retaining belt (80) still has disadvantages, such as:

1. Difficult to fabricate:

Because the retaining belt (80) uses its inherent resilience to secure the heat sink (72) to the socket, the tolerance between the retaining belt (80) and the heat sink (72) must be kept as small as possible, which increases the difficulty of fabrication.

2. Engagement of the retaining belt (80) to the heat sink (72) is not secured:

Although, as mentioned above, the tolerance between the retaining belt (80) and the heat sink (72) is kept as small as possible to allow the latch block (55) to be received in the through hole of the clamping portion, the engagement between the retaining belt (80) and the heat sink (72) is not as good as expected. That is, the engagement of the retaining belt (80) to the heat sink (72) will not securely hold the heat sink (72) in position, especially under the vibration of the fan (75).

It is an objective of the invention to provide an improved retaining device to obviate and mitigate the aforementioned problems.

SUMMARY OF THE INVENTION

The main objective of the invention is to provide an improved retaining device to secure the engagement of the retaining belt to the heat sink to increase the heat dissipation effect.

In order to accomplish the aforementioned objective, the invention has a hollow retaining belt with a clamp and a through hole defined in each free end to correspond to the latch blocks of the heat sink. Furthermore, a handle provided to pivot relative to the retaining belt has an arcuate portion and a flat portion formed to correspond to the skirt of the heat sink, such that when the handle pivots and the arcuate portion is engaged with the skirt of the heat sink, the heat sink will be securely positioned with respect to the socket of the CPU. When the flat portion of the handle is engaged with the skirt of the heat sink, the heat sink is then able to be separated from the socket.

With such an arrangement, the heat sink can be securely positioned in place, and the heat dissipation effect is thus increased.

Another objective of the invention is to provide multiple pairs of horizontal ribs formed between two inner sides of the hollow retaining belt and having notches defined in the outer periphery of each of the ribs, such that when the retaining belt is placed on top of the heat sink, the friction between the outer periphery of the ribs and the fins of the heat sink will further increase the engagement between the retaining belt and the heat sink.

Other objects, advantages and novel features of the invention will become more apparent from the following detailed description when taken in conjunction with the accompanying drawings.

DETAILED DESCRIPTION OF PREFERRED EMBODIMENT

Figure 1:
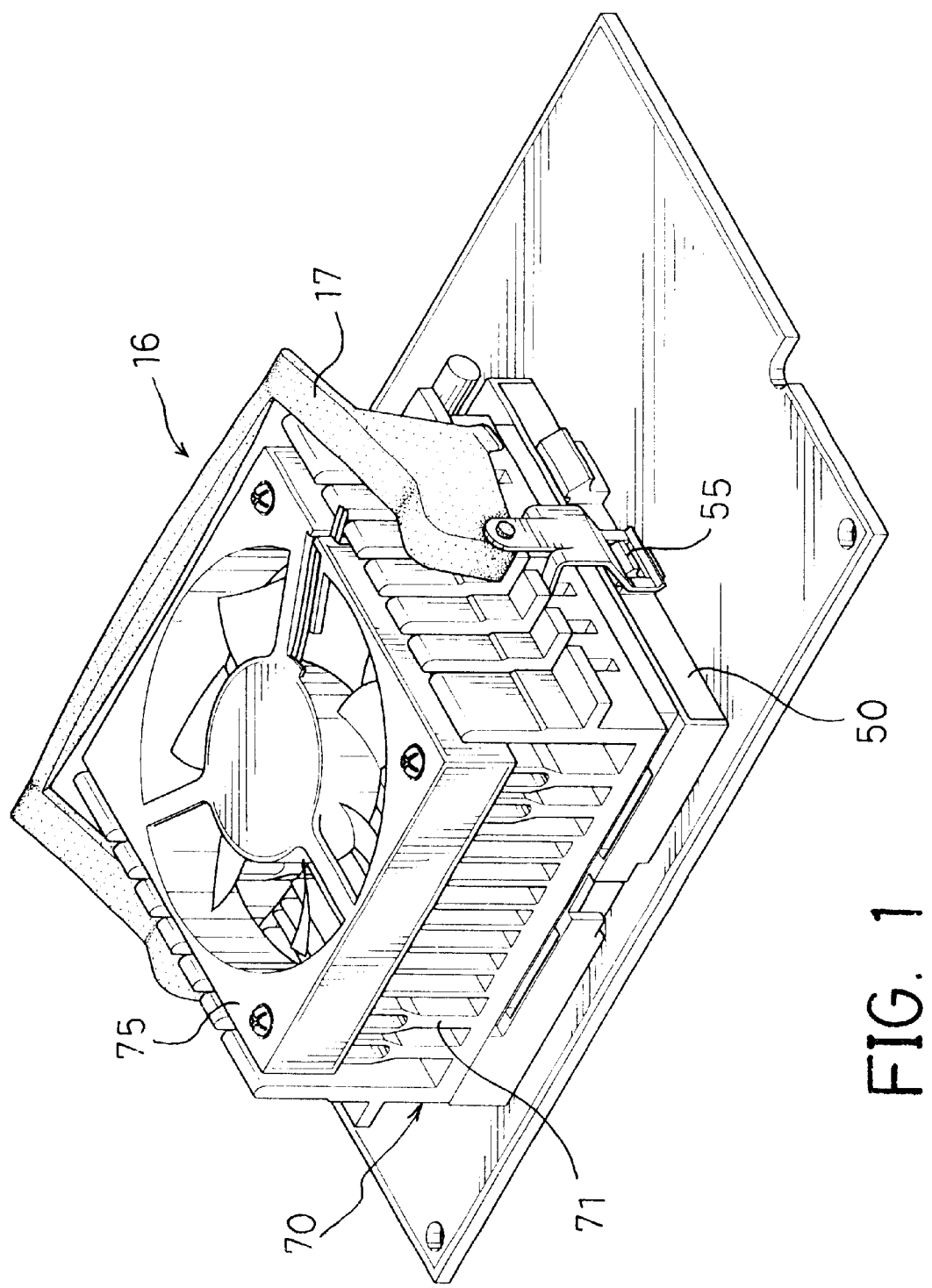
FIG. 1 is a perspective view of the retaining device in accordance with the present invention securing a heat sink to the socket of a CPU.
Figure 2:
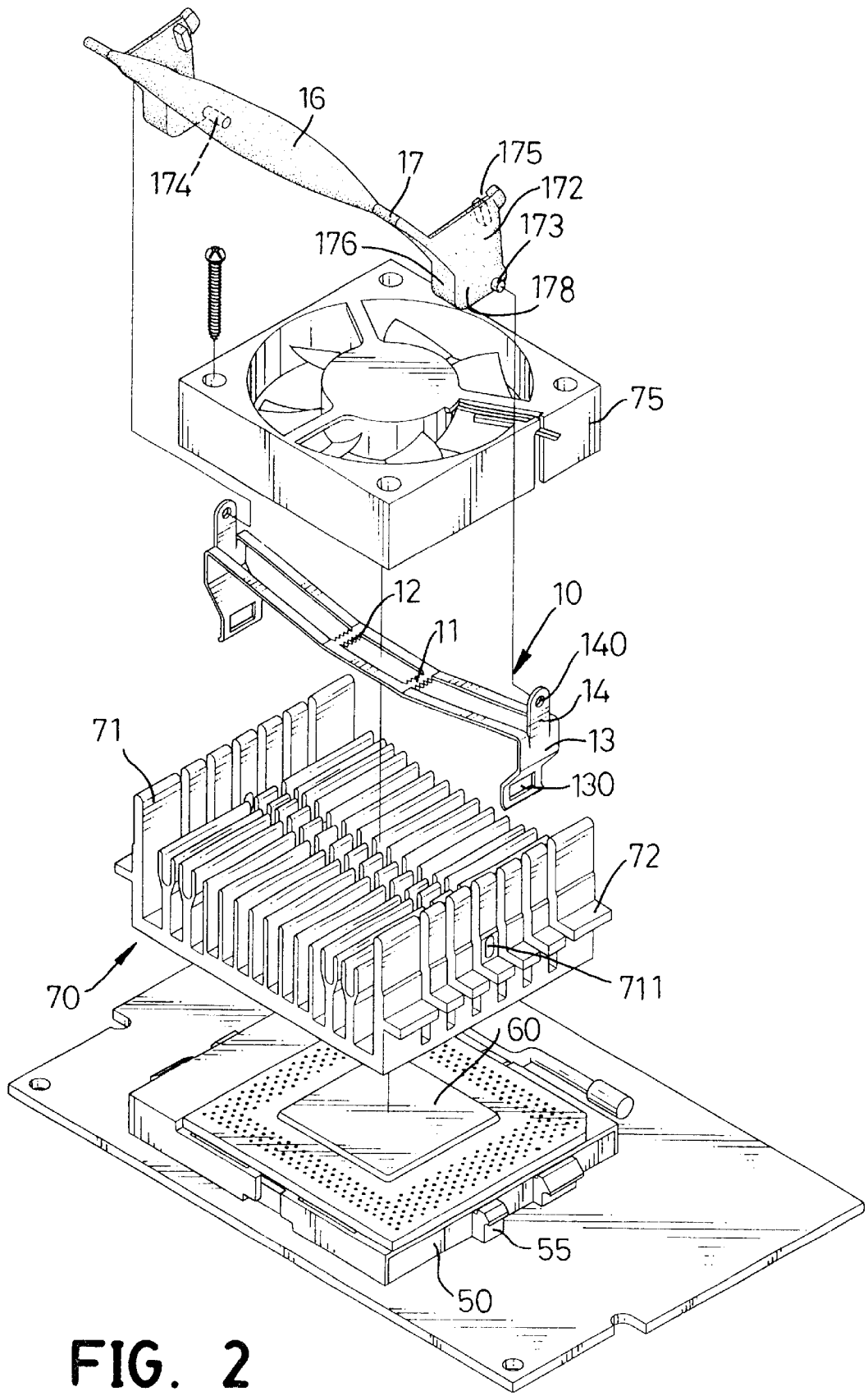
FIG. 2 is an exploded perspective view of the retaining device, the socket, the heat sink and the fan in FIG. 1.

With reference to FIG. 1 and FIG. 2, a retaining device for use with a CPU heat sink (70) has a hollow retaining belt (10) and a handle (16) pivotally connected with the retaining belt (10). The retaining belt (10) has at least two transverse ribs (11), two clamps (13) and two lugs (14). The two transverse ribs (11) are formed between two inner sides of the belt (10), and each has multiple notches (12) defined in the outer periphery. A clamp (13) is formed on each free end of the retaining belt (10) and has a through hole (130) defined to correspond to one of a pair of latch blocks (55) formed on opposite sides of the socket (50) provided to receive a CPU (60). A lug (14) is formed to extend out from the clamp (13) and has a pivot hole (140) defined therein. The handle (16) has two legs (17) respectively formed to correspond to one of the clamps (13) of the retaining belt (10). Each of the two legs (17) has a limiting boss (172) formed on a free end. The limiting boss (172) has an outer extension (173), an inner extension (174) and a pair of stops (175). The outer extension (173) corresponds to the pivot hole (140) in the retaining belt (10). The inner extension (174) corresponds to an elongate hole (711) defined in a fin (71) of the heat sink (70). The pair of stops (175) are formed on the inner side of the limiting boss (172) and are spaced apart from each other. The leg (17) further has an arcuate portion (176) and a flat portion (178) formed on the outer periphery.

Figure 3:
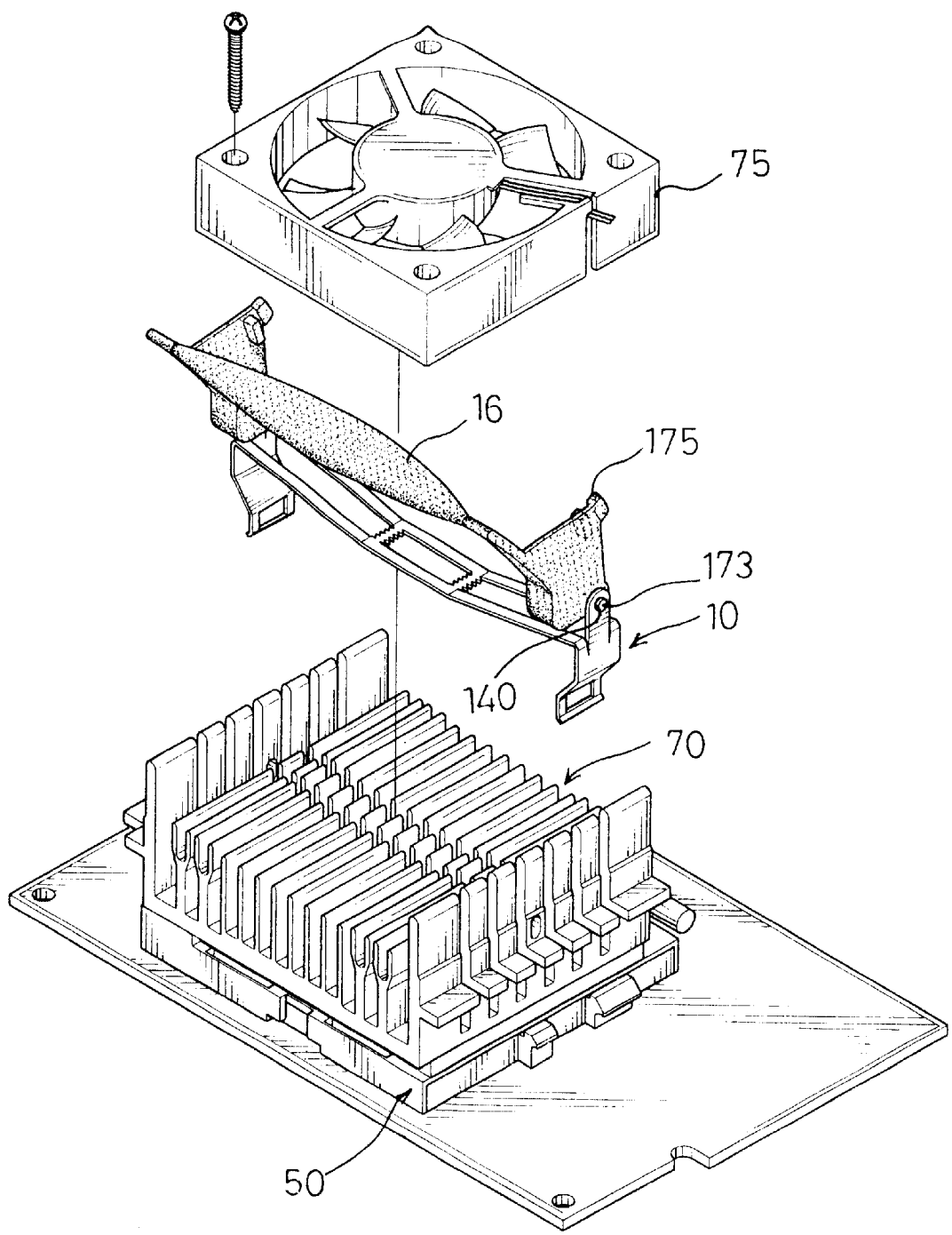
FIG. 3 is a partially exploded perspective view of the heat sink assembled with the socket and the retaining belt assembled with the handle in FIG. 2.
Figure 4:
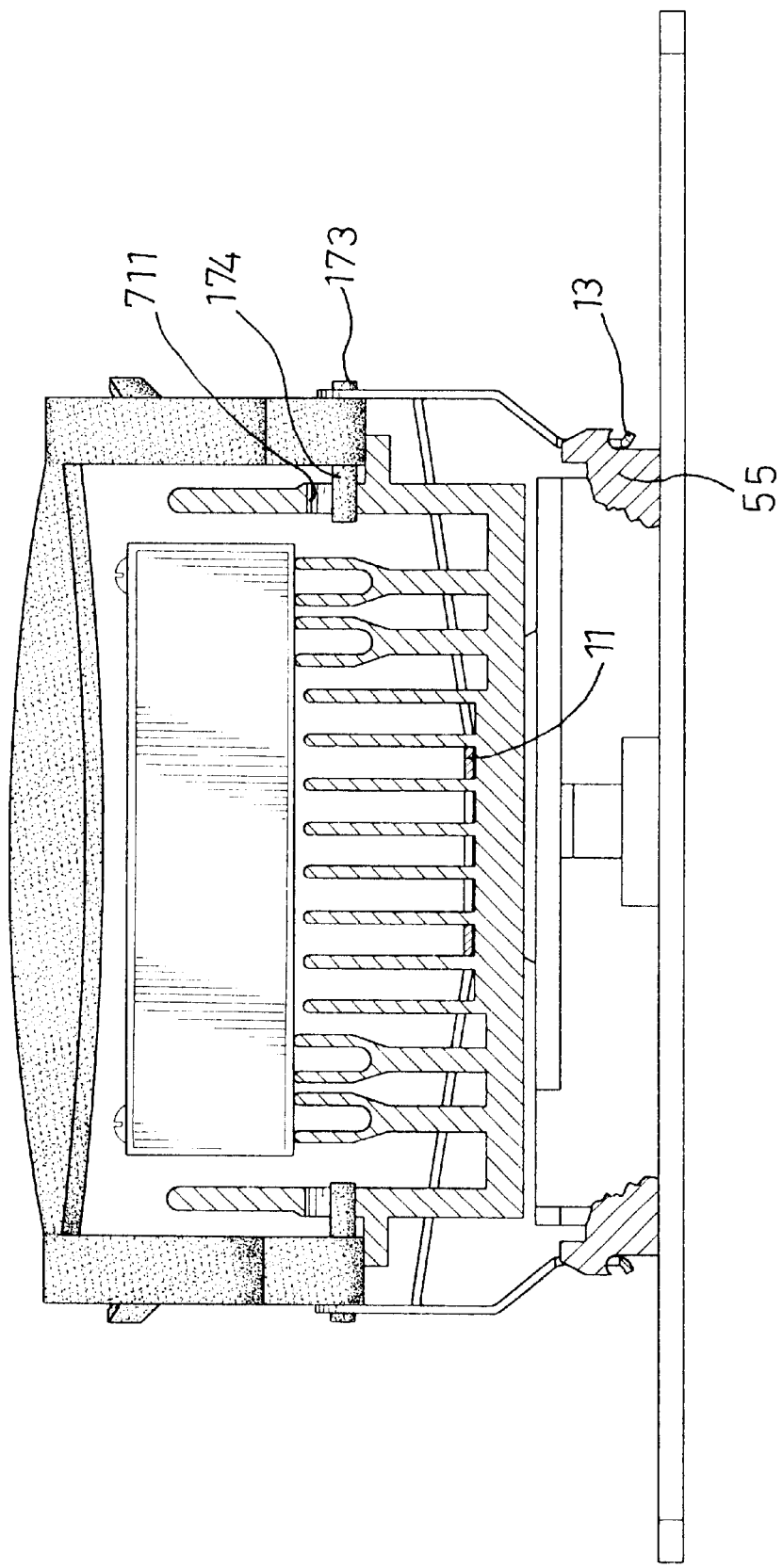
FIG. 4 is a side plan view in partial section of the retaining device, the socket, the heat sink and the fan in FIG. 1.
Figure 5:
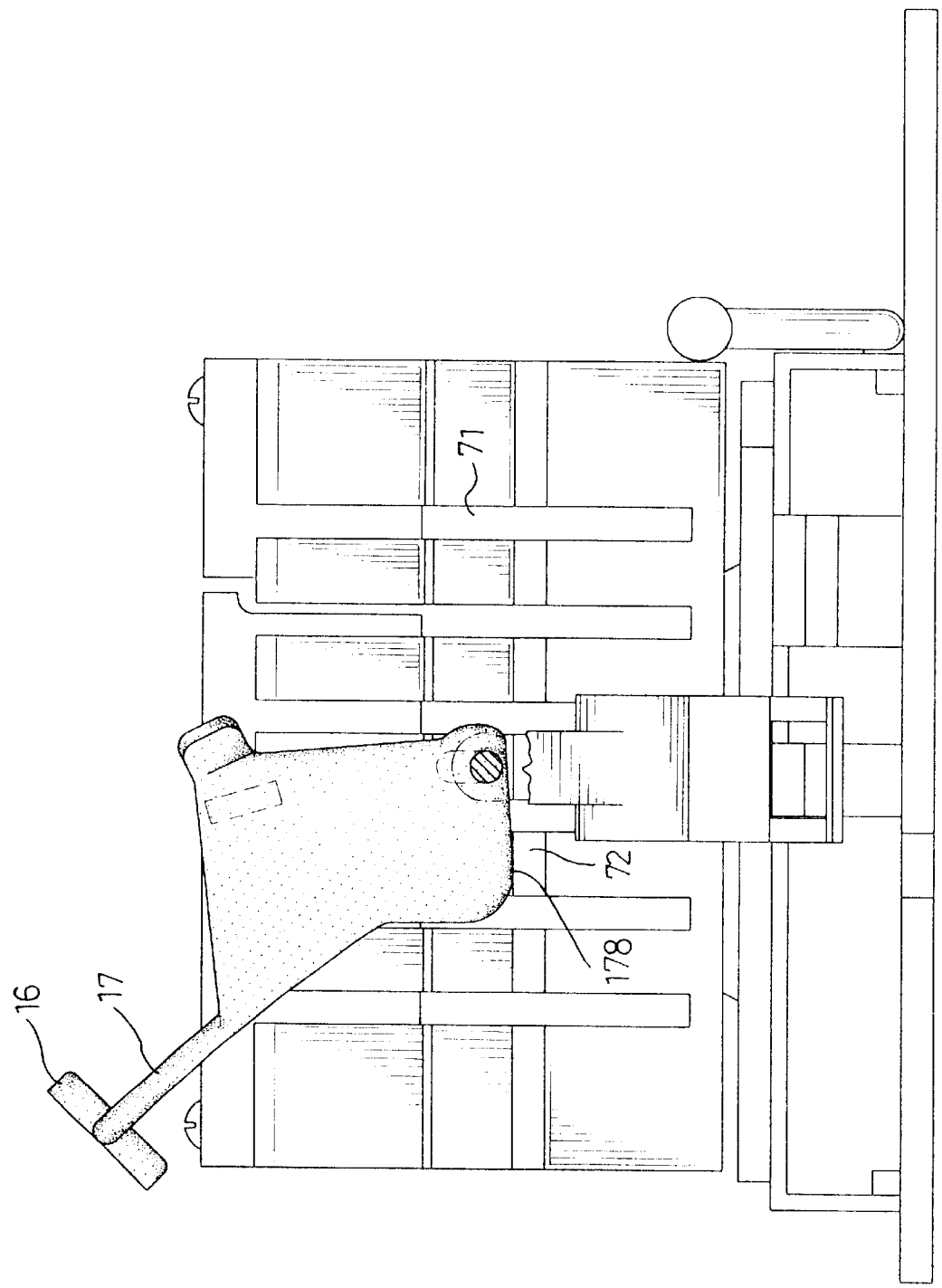
FIG. 5 is a side plan view of the retaining belt in FIG. 3 not secured with the heat sink and the arcuate portion of the handle abutting the skirt of the heat sink.

With reference to FIG. 3, the heat sink (70) is first placed on top of the socket (50) which has the CPU (60) mounted thereon, and the handle (16) is connected to the retaining belt (10) by inserting the pair of outer extensions (173) into the corresponding pivot holes (140) to allow the handle (16) to pivot relative to the retaining belt (10). Thereafter, as shown in FIG. 4, latch blocks (55) formed on opposite sides of the socket (50) are inserted into the corresponding through holes (130) of the retaining belt (10), and the inner extensions (174) of the handle (16) are inserted into the corresponding pivot holes (140) in the lugs (14). When the aforementioned process is finished, the flat portion (178) engages the skirt (72) of the fin (71), as shown in FIG. 5.

Figure 6:
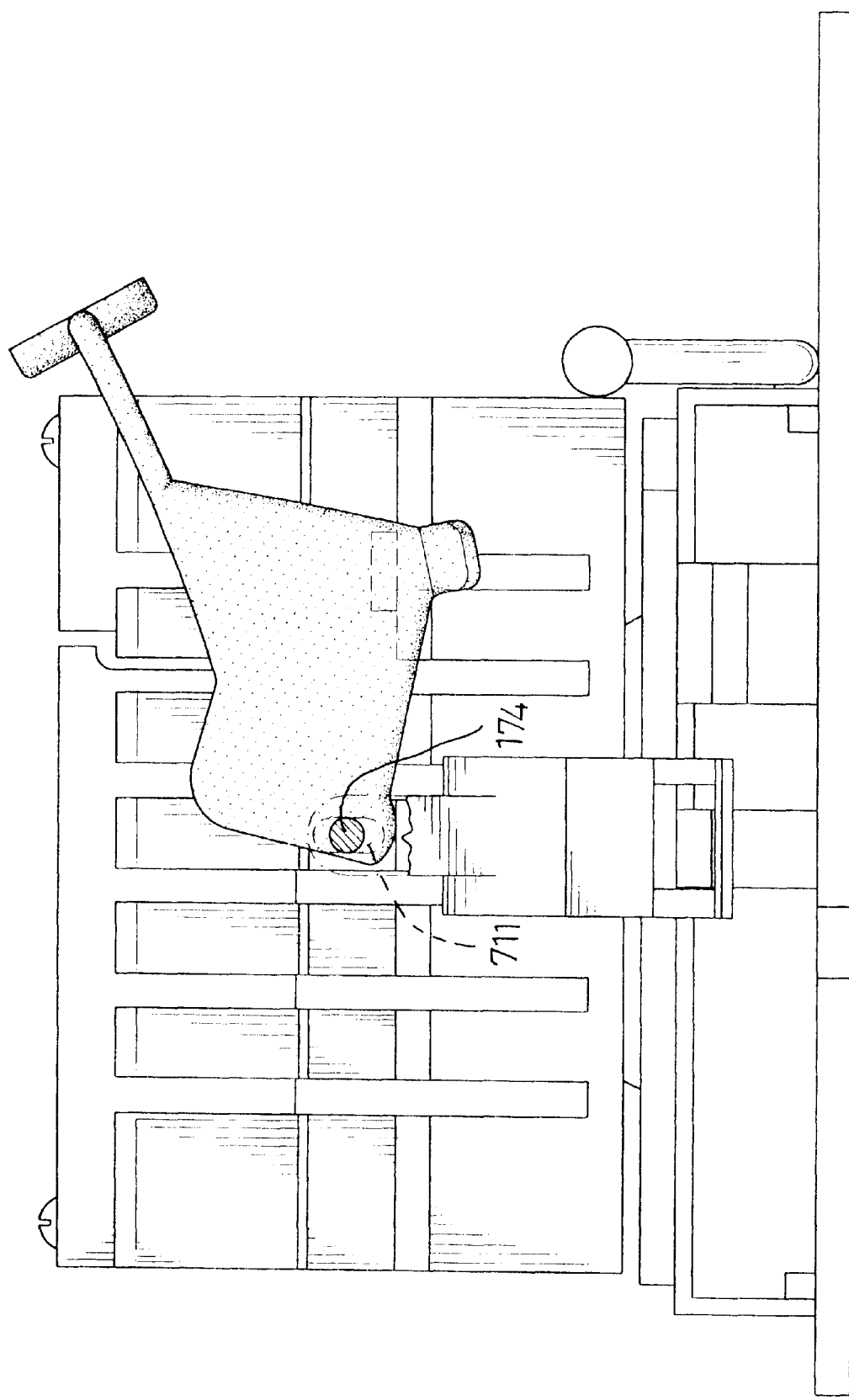
FIG. 6 is a side plan view of the retaining belt in FIG. 3 secured with the heat sink and the flat portion of the handle abutting the skirt of the heat sink.

By pivoting the handle (16) in the right direction as shown in FIG. 6, the arcuate portion (176) will then gradually engage the skirt (72) of the heat sink (70). While the arcuate portion (176) engages the skirt (72), the inner extension (174) will ascend in the elongate hole (711), which will also lift the retaining belt (10) with respect to the socket (50). Meanwhile, the pair of stops (175) will have one fin (71) received therebetween so as to increase the holding effect of the retaining device to the heat sink relative to the socket (50). Therefore, the engagement between the heat sink (70) and the socket (50) is enhanced by the lifting movement of the retaining belt (10) together with the handle (16).

Figure 7:
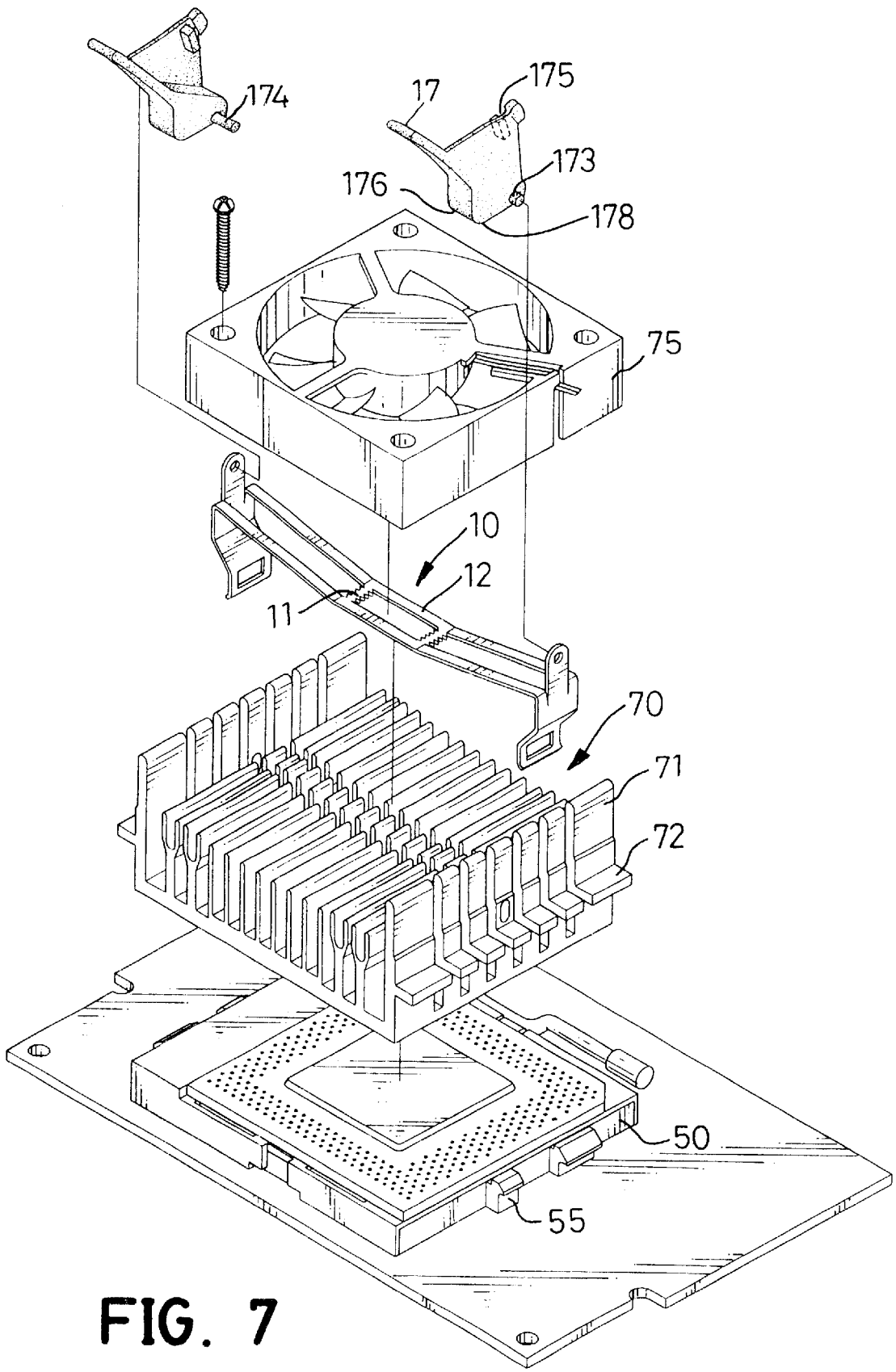
FIG. 7 is an exploded perspective view of another preferred embodiment of retaining device in accordance with the present invention.
Figure 8:
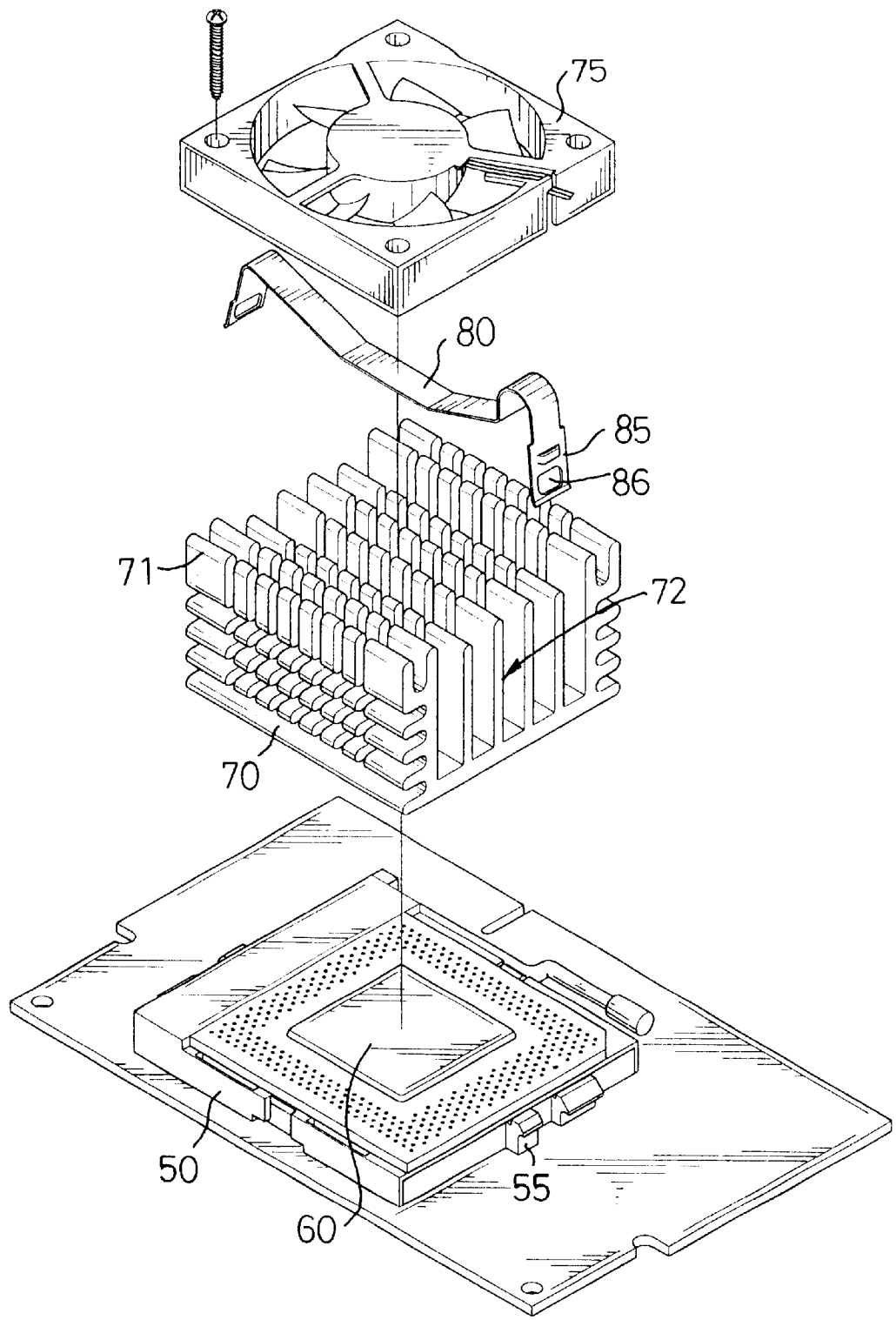
FIG. 8 is an exploded perspective view of a conventional retaining device for use with a CPU socket.

With reference to FIG. 7, another preferred embodiment of the invention is shown. The parts of the retaining device are generally identical to those described in FIGS. 1 to 6. The only difference is that the handle (16) is now changed to two individual units rather than a combined single unit. That is, there is no connection between the two individual units, and only the legs (17) remain and the configuration provided on the leg (17). Therefore, the difference in operation is that the user will have to operate each of the individual units to secure the engagement between the heat sink (70) and the socket (50). Yet, the effect of enhancing the engagement is still the same as that described earlier.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A retaining device for attaching a heat sink to a CPU socket, comprising:

a retaining belt having a clamp formed on each free end thereof and having a through hole defined for receiving latch blocks of the socket;

a handle pivotally engaged with the retaining belt and having two legs respectively formed to correspond to one of the clamps, each leg having an arcuate portion and a flat portion formed on the outer periphery thereof, and whereby when the handle pivots relative to the retaining belt, the engagement of the arcuate portions to the heat sink will secure the engagement between the heat sink and the socket and the engagement of the flat portions to the heat sink will loosen the engagement between the heat sink and the socket.

2. The retaining device as claimed in claim 1, wherein the retaining belt further has a lug formed to extend out from the clamp and having a pivot hole defined to receive a pin therein; and wherein each of the legs has a limiting boss formed at a distal end thereof and having an outer extension formed to correspond to the pivot hole.

3. The retaining device as claimed in claim 2, wherein the retaining belt is made hollow and has at least two ribs formed between two inner sides thereof and each rib has multiple notches defined in an outer periphery thereof to increase the friction with the heat sink.

4. The retaining device as claimed in claim 2, the handle has an inner extension formed on the legs to be inserted into the heat sink.

5. The retaining device as claimed in claim 4, wherein the handle further has a pair of spaced stops formed on the legs for receiving the fin of the heat sink when the arcuate portion engages the heat sink.

6. The retaining device as claim 1, wherein the legs are not connected with each other.

* * * * *